(12) United States Patent
Chaji

(10) Patent No.: US 9,502,653 B2
(45) Date of Patent: Nov. 22, 2016

(54) ELECTRODE CONTACTS

(71) Applicant: Ignis Innovation Inc., Waterloo (CA)

(72) Inventor: Gholamreza Chaji, Waterloo (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

(21) Appl. No.: 14/581,193

(22) Filed: Dec. 23, 2014

(65) Prior Publication Data

US 2015/0179972 A1 Jun. 25, 2015

Related U.S. Application Data

(60) Provisional application No. 61/929,699, filed on Jan. 21, 2014, provisional application No. 61/920,732, filed on Dec. 25, 2013.

(51) Int. Cl.
*H01L 23/52* (2006.01)
*H01L 51/00* (2006.01)
*H01L 27/32* (2006.01)

(52) U.S. Cl.
CPC ....... *H01L 51/0021* (2013.01); *H01L 27/3248* (2013.01)

(58) Field of Classification Search
USPC ....................................................... 257/211
See application file for complete search history.

(56) References Cited

U.S. PATENT DOCUMENTS

| | | |
|---|---|---|
| 4,354,162 A | 10/1982 | Wright |
| 4,758,831 A | 7/1988 | Kasahara et al. |
| 4,963,860 A | 10/1990 | Stewart |
| 4,975,691 A | 12/1990 | Lee |
| 4,996,523 A | 2/1991 | Bell et al. |
| 5,051,739 A | 9/1991 | Hayashida et al. |
| 5,222,082 A | 6/1993 | Plus |
| 5,266,515 A | 11/1993 | Robb et al. |

(Continued)

FOREIGN PATENT DOCUMENTS

| | | |
|---|---|---|
| CA | 1294034 | 1/1992 |
| CA | 2109951 | 11/1992 |

(Continued)

OTHER PUBLICATIONS

Ahnood et al.: "Effect of threshold voltage instability on field effect mobility in thin film transistors deduced from constant current measurements"; dated Aug. 2009 (3 pages).

(Continued)

*Primary Examiner* — Andy Huynh
*Assistant Examiner* — Sitaramarao S Yechuri
(74) *Attorney, Agent, or Firm* — Nixon Peabody LLP

(57) ABSTRACT

A device structure providing contact to conductive layers via a deep trench structure is disclosed. The device includes a first dielectric layer including a first opening. A first conductive layer is deposited over the first dielectric layer and the first opening. A second dielectric layer is deposited on the first conductive layer. The second dielectric layer includes a second opening. A second conductive layer is deposited over the second dielectric layer and the first and second openings. A semiconductor layer is deposited on the second dielectric layer such that the semiconductor layer is not continuous on at least part of the walls of the first or second openings. A top electrode layer is deposited on the semiconductor layer. The top electrode layer is in contact with the second conductive layer on at least part of the walls of the first or second openings.

19 Claims, 5 Drawing Sheets

(56) References Cited

U.S. PATENT DOCUMENTS

| | | |
|---|---|---|
| 5,498,880 A | 3/1996 | Lee et al. |
| 5,589,847 A | 12/1996 | Lewis |
| 5,619,033 A | 4/1997 | Weisfield |
| 5,648,276 A | 7/1997 | Hara et al. |
| 5,670,973 A | 9/1997 | Bassetti et al. |
| 5,684,365 A | 11/1997 | Tang et al. |
| 5,686,935 A | 11/1997 | Weisbrod |
| 5,712,653 A | 1/1998 | Katoh et al. |
| 5,714,968 A | 2/1998 | Ikeda |
| 5,747,928 A | 5/1998 | Shanks et al. |
| 5,748,160 A | 5/1998 | Shieh et al. |
| 5,784,042 A | 7/1998 | Ono et al. |
| 5,790,234 A | 8/1998 | Matsuyama |
| 5,815,303 A | 9/1998 | Berlin |
| 5,870,071 A | 2/1999 | Kawahata |
| 5,874,803 A | 2/1999 | Garbuzov et al. |
| 5,880,582 A | 3/1999 | Sawada |
| 5,903,248 A | 5/1999 | Irwin |
| 5,917,280 A | 6/1999 | Burrows et al. |
| 5,923,794 A | 7/1999 | McGrath et al. |
| 5,952,789 A | 9/1999 | Stewart et al. |
| 5,990,629 A | 11/1999 | Yamada et al. |
| 6,023,259 A | 2/2000 | Howard et al. |
| 6,069,365 A | 5/2000 | Chow et al. |
| 6,081,131 A | 6/2000 | Ishii |
| 6,091,203 A | 7/2000 | Kawashima et al. |
| 6,097,360 A | 8/2000 | Holloman |
| 6,144,222 A | 11/2000 | Ho |
| 6,157,583 A | 12/2000 | Starnes et al. |
| 6,166,489 A | 12/2000 | Thompson et al. |
| 6,177,915 B1 | 1/2001 | Beeteson et al. |
| 6,225,846 B1 | 5/2001 | Wada et al. |
| 6,229,508 B1 | 5/2001 | Kane |
| 6,232,939 B1 | 5/2001 | Saito et al. |
| 6,246,180 B1 | 6/2001 | Nishigaki |
| 6,252,248 B1 | 6/2001 | Sano et al. |
| 6,259,424 B1 | 7/2001 | Kurogane |
| 6,274,887 B1 | 8/2001 | Yamazaki et al. |
| 6,288,696 B1 | 9/2001 | Holloman |
| 6,300,928 B1 | 10/2001 | Kim |
| 6,303,963 B1 | 10/2001 | Ohtani et al. |
| 6,306,694 B1 | 10/2001 | Yamazaki et al. |
| 6,307,322 B1 | 10/2001 | Dawson et al. |
| 6,316,786 B1 | 11/2001 | Mueller et al. |
| 6,320,325 B1 | 11/2001 | Cok et al. |
| 6,323,631 B1 | 11/2001 | Juang |
| 6,323,832 B1 | 11/2001 | Nishizawa et al. |
| 6,345,085 B1 | 2/2002 | Yeo et al. |
| 6,348,835 B1 | 2/2002 | Sato et al. |
| 6,365,917 B1 | 4/2002 | Yamazaki |
| 6,373,453 B1 | 4/2002 | Yudasaka |
| 6,384,427 B1 | 5/2002 | Yamazaki et al. |
| 6,392,617 B1 | 5/2002 | Gleason |
| 6,399,988 B1 | 6/2002 | Yamazaki |
| 6,414,661 B1 | 7/2002 | Shen et al. |
| 6,420,758 B1 | 7/2002 | Nakajima |
| 6,420,834 B2 | 7/2002 | Yamazaki et al. |
| 6,420,988 B1 | 7/2002 | Azami et al. |
| 6,433,488 B1 | 8/2002 | Bu |
| 6,445,376 B2 | 9/2002 | Parrish |
| 6,468,638 B2 | 10/2002 | Jacobsen et al. |
| 6,489,952 B1 | 12/2002 | Tanaka et al. |
| 6,501,098 B2 | 12/2002 | Yamazaki |
| 6,501,466 B1 | 12/2002 | Yamagishi et al. |
| 6,512,271 B1 | 1/2003 | Yamazaki et al. |
| 6,518,594 B1 | 2/2003 | Nakajima et al. |
| 6,524,895 B2 | 2/2003 | Yamazaki et al. |
| 6,531,713 B1 | 3/2003 | Yamazaki |
| 6,559,594 B2 | 5/2003 | Fukunaga et al. |
| 6,573,195 B1 | 6/2003 | Yamazaki et al. |
| 6,573,584 B1 | 6/2003 | Nagakari et al. |
| 6,576,926 B1 | 6/2003 | Yamazaki et al. |
| 6,580,408 B1 | 6/2003 | Bae et al. |
| 6,580,657 B2 | 6/2003 | Sanford et al. |
| 6,583,775 B1 | 6/2003 | Sekiya et al. |
| 6,583,776 B2 | 6/2003 | Yamazaki et al. |
| 6,587,086 B1 | 7/2003 | Koyama |
| 6,593,691 B2 | 7/2003 | Nishi et al. |
| 6,594,606 B2 | 7/2003 | Everitt |
| 6,597,203 B2 | 7/2003 | Forbes |
| 6,611,108 B2 | 8/2003 | Kimura |
| 6,617,644 B2 | 9/2003 | Yamazaki et al. |
| 6,618,030 B2 | 9/2003 | Kane et al. |
| 6,641,933 B1 | 11/2003 | Yamazaki et al. |
| 6,661,180 B2 | 12/2003 | Koyama |
| 6,661,397 B2 | 12/2003 | Mikami et al. |
| 6,670,637 B2 | 12/2003 | Yamazaki et al. |
| 6,677,713 B1 | 1/2004 | Sung |
| 6,680,577 B1 | 1/2004 | Inukai et al. |
| 6,687,266 B1 | 2/2004 | Ma et al. |
| 6,690,344 B1 | 2/2004 | Takeuchi et al. |
| 6,693,388 B2 | 2/2004 | Oomura |
| 6,693,610 B2 | 2/2004 | Shannon et al. |
| 6,697,057 B2 | 2/2004 | Koyama et al. |
| 6,720,942 B2 | 4/2004 | Lee et al. |
| 6,734,636 B2 | 5/2004 | Sanford et al. |
| 6,738,034 B2 | 5/2004 | Kaneko et al. |
| 6,738,035 B1 | 5/2004 | Fan |
| 6,771,028 B1 | 8/2004 | Winters |
| 6,777,712 B2 | 8/2004 | Sanford et al. |
| 6,780,687 B2 | 8/2004 | Nakajima et al. |
| 6,806,638 B2 | 10/2004 | Lih et al. |
| 6,806,857 B2 | 10/2004 | Sempel et al. |
| 6,809,706 B2 | 10/2004 | Shimoda |
| 6,859,193 B1 | 2/2005 | Yumoto |
| 6,861,670 B1 | 3/2005 | Ohtani et al. |
| 6,873,117 B2 | 3/2005 | Ishizuka |
| 6,873,320 B2 | 3/2005 | Nakamura |
| 6,878,968 B1 | 4/2005 | Ohnuma |
| 6,909,114 B1 | 6/2005 | Yamazaki |
| 6,909,419 B2 | 6/2005 | Zavracky et al. |
| 6,919,871 B2 | 7/2005 | Kwon |
| 6,937,215 B2 | 8/2005 | Lo |
| 6,940,214 B1 | 9/2005 | Komiya et al. |
| 6,943,500 B2 | 9/2005 | LeChevalier |
| 6,954,194 B2 | 10/2005 | Matsumoto et al. |
| 6,956,547 B2 | 10/2005 | Bae et al. |
| 6,995,510 B2 | 2/2006 | Murakami et al. |
| 6,995,519 B2 | 2/2006 | Arnold et al. |
| 7,022,556 B1 | 4/2006 | Adachi |
| 7,023,408 B2 | 4/2006 | Chen et al. |
| 7,027,015 B2 | 4/2006 | Booth, Jr. et al. |
| 7,034,793 B2 | 4/2006 | Sekiya et al. |
| 7,088,051 B1 | 8/2006 | Cok |
| 7,106,285 B2 | 9/2006 | Naugler |
| 7,116,058 B2 | 10/2006 | Lo et al. |
| 7,129,914 B2 | 10/2006 | Knapp et al. |
| 7,129,917 B2 | 10/2006 | Yamazaki et al. |
| 7,141,821 B1 | 11/2006 | Yamazaki et al. |
| 7,161,566 B2 | 1/2007 | Cok et al. |
| 7,193,589 B2 | 3/2007 | Yoshida et al. |
| 7,199,516 B2 | 4/2007 | Seo et al. |
| 7,220,997 B2 | 5/2007 | Nakata |
| 7,235,810 B1 | 6/2007 | Yamazaki et al. |
| 7,245,277 B2 | 7/2007 | Ishizuka |
| 7,248,236 B2 | 7/2007 | Nathan et al. |
| 7,264,979 B2 | 9/2007 | Yamagata et al. |
| 7,274,345 B2 | 9/2007 | Imamura et al. |
| 7,274,363 B2 | 9/2007 | Ishizuka et al. |
| 7,279,711 B1 | 10/2007 | Yamazaki et al. |
| 7,304,621 B2 | 12/2007 | Oomori et al. |
| 7,310,092 B2 | 12/2007 | Imamura |
| 7,315,295 B2 | 1/2008 | Kimura |
| 7,317,429 B2 | 1/2008 | Shirasaki et al. |
| 7,319,465 B2 | 1/2008 | Mikami et al. |
| 7,321,348 B2 | 1/2008 | Cok et al. |
| 7,339,636 B2 | 3/2008 | Voloschenko et al. |
| 7,355,574 B1 | 4/2008 | Leon et al. |
| 7,358,941 B2 | 4/2008 | Ono et al. |
| 7,402,467 B1 | 7/2008 | Kadono et al. |
| 7,414,600 B2 | 8/2008 | Nathan et al. |
| 7,432,885 B2 | 10/2008 | Asano et al. |
| 7,474,285 B2 | 1/2009 | Kimura |
| 7,485,478 B2 | 2/2009 | Yamagata et al. |

(56) References Cited

U.S. PATENT DOCUMENTS

| | | |
|---|---|---|
| 7,502,000 B2 | 3/2009 | Yuki et al. |
| 7,535,449 B2 | 5/2009 | Miyazawa |
| 7,554,512 B2 | 6/2009 | Steer |
| 7,569,849 B2 | 8/2009 | Nathan et al. |
| 7,619,594 B2 | 11/2009 | Hu |
| 7,619,597 B2 | 11/2009 | Nathan et al. |
| 7,697,052 B1 | 4/2010 | Yamazaki et al. |
| 7,825,419 B2 | 11/2010 | Yamagata et al. |
| 7,859,492 B2 | 12/2010 | Kohno |
| 7,868,859 B2 | 1/2011 | Tomida et al. |
| 7,876,294 B2 | 1/2011 | Sasaki et al. |
| 7,948,170 B2 | 5/2011 | Striakhilev et al. |
| 7,969,390 B2 | 6/2011 | Yoshida |
| 7,995,010 B2 | 8/2011 | Yamazaki et al. |
| 8,044,893 B2 | 10/2011 | Nathan et al. |
| 8,115,707 B2 | 2/2012 | Nathan et al. |
| 8,378,362 B2 | 2/2013 | Heo et al. |
| 8,493,295 B2 | 7/2013 | Yamazaki et al. |
| 8,497,525 B2 | 7/2013 | Yamagata et al. |
| 2001/0002703 A1 | 6/2001 | Koyama |
| 2001/0004190 A1 | 6/2001 | Nishi et al. |
| 2001/0013806 A1 | 8/2001 | Notani |
| 2001/0015653 A1 | 8/2001 | De Jong et al. |
| 2001/0020926 A1 | 9/2001 | Kuijk |
| 2001/0026127 A1 | 10/2001 | Yoneda et al. |
| 2001/0026179 A1 | 10/2001 | Saeki |
| 2001/0026257 A1 | 10/2001 | Kimura |
| 2001/0030323 A1 | 10/2001 | Ikeda |
| 2001/0033199 A1 | 10/2001 | Aoki |
| 2001/0038098 A1 | 11/2001 | Yamazaki et al. |
| 2001/0043173 A1 | 11/2001 | Troutman |
| 2001/0045929 A1 | 11/2001 | Prache et al. |
| 2001/0052606 A1 | 12/2001 | Sempel et al. |
| 2001/0052898 A1 | 12/2001 | Osame et al. |
| 2002/0000576 A1 | 1/2002 | Inukai |
| 2002/0011796 A1 | 1/2002 | Koyama |
| 2002/0011799 A1 | 1/2002 | Kimura |
| 2002/0011981 A1 | 1/2002 | Kuijk |
| 2002/0015031 A1 | 2/2002 | Fujita et al. |
| 2002/0015032 A1 | 2/2002 | Koyama et al. |
| 2002/0030528 A1 | 3/2002 | Matsumoto et al. |
| 2002/0030647 A1 | 3/2002 | Hack et al. |
| 2002/0036463 A1 | 3/2002 | Yoneda et al. |
| 2002/0047852 A1 | 4/2002 | Inukai et al. |
| 2002/0048829 A1 | 4/2002 | Yamazaki et al. |
| 2002/0050795 A1 | 5/2002 | Imura |
| 2002/0053401 A1 | 5/2002 | Ishikawa et al. |
| 2002/0070909 A1 | 6/2002 | Asano et al. |
| 2002/0080108 A1 | 6/2002 | Wang |
| 2002/0084463 A1 | 7/2002 | Sanford et al. |
| 2002/0101172 A1 | 8/2002 | Bu |
| 2002/0101433 A1 | 8/2002 | McKnight |
| 2002/0113248 A1 | 8/2002 | Yamagata et al. |
| 2002/0122308 A1 | 9/2002 | Ikeda |
| 2002/0130686 A1 | 9/2002 | Forbes |
| 2002/0154084 A1 | 10/2002 | Tanaka et al. |
| 2002/0158823 A1 | 10/2002 | Zavracky et al. |
| 2002/0163314 A1 | 11/2002 | Yamazaki et al. |
| 2002/0167471 A1 | 11/2002 | Everitt |
| 2002/0180369 A1 | 12/2002 | Koyama |
| 2002/0180721 A1 | 12/2002 | Kimura et al. |
| 2002/0186214 A1 | 12/2002 | Siwinski |
| 2002/0190332 A1 | 12/2002 | Lee et al. |
| 2002/0190924 A1 | 12/2002 | Asano et al. |
| 2002/0190971 A1 | 12/2002 | Nakamura et al. |
| 2002/0195967 A1 | 12/2002 | Kim et al. |
| 2002/0195968 A1 | 12/2002 | Sanford et al. |
| 2003/0020413 A1 | 1/2003 | Oomura |
| 2003/0030603 A1 | 2/2003 | Shimoda |
| 2003/0062524 A1 | 4/2003 | Kimura |
| 2003/0063081 A1 | 4/2003 | Kimura et al. |
| 2003/0071804 A1 | 4/2003 | Yamazaki et al. |
| 2003/0076048 A1 | 4/2003 | Rutherford |
| 2003/0090445 A1 | 5/2003 | Chen et al. |
| 2003/0090447 A1 | 5/2003 | Kimura |
| 2003/0090481 A1 | 5/2003 | Kimura |
| 2003/0095087 A1 | 5/2003 | Libsch et al. |
| 2003/0107560 A1 | 6/2003 | Yumoto et al. |
| 2003/0111966 A1 | 6/2003 | Mikami et al. |
| 2003/0122745 A1 | 7/2003 | Miyazawa |
| 2003/0140958 A1 | 7/2003 | Yang et al. |
| 2003/0151569 A1 | 8/2003 | Lee et al. |
| 2003/0169219 A1 | 9/2003 | LeChevalier |
| 2003/0174152 A1 | 9/2003 | Noguchi |
| 2003/0179626 A1 | 9/2003 | Sanford et al. |
| 2003/0197663 A1 | 10/2003 | Lee et al. |
| 2003/0206060 A1 | 11/2003 | Suzuki |
| 2003/0230980 A1 | 12/2003 | Forrest et al. |
| 2004/0027063 A1 | 2/2004 | Nishikawa |
| 2004/0056604 A1 | 3/2004 | Shih et al. |
| 2004/0066357 A1 | 4/2004 | Kawasaki |
| 2004/0070557 A1 | 4/2004 | Asano et al. |
| 2004/0080262 A1 | 4/2004 | Park et al. |
| 2004/0080470 A1 | 4/2004 | Yamazaki et al. |
| 2004/0090400 A1 | 5/2004 | Yoo |
| 2004/0108518 A1 | 6/2004 | Jo |
| 2004/0113903 A1 | 6/2004 | Mikami et al. |
| 2004/0129933 A1 | 7/2004 | Nathan et al. |
| 2004/0130516 A1 | 7/2004 | Nathan et al. |
| 2004/0135749 A1 | 7/2004 | Kondakov et al. |
| 2004/0145547 A1 | 7/2004 | Oh |
| 2004/0150592 A1 | 8/2004 | Mizukoshi et al. |
| 2004/0150594 A1 | 8/2004 | Koyama et al. |
| 2004/0150595 A1 | 8/2004 | Kasai |
| 2004/0155841 A1 | 8/2004 | Kasai |
| 2004/0174347 A1 | 9/2004 | Sun et al. |
| 2004/0174349 A1 | 9/2004 | Libsch |
| 2004/0183759 A1 | 9/2004 | Stevenson et al. |
| 2004/0189627 A1 | 9/2004 | Shirasaki et al. |
| 2004/0196275 A1 | 10/2004 | Hattori |
| 2004/0201554 A1 | 10/2004 | Satoh |
| 2004/0207615 A1 | 10/2004 | Yumoto |
| 2004/0233125 A1 | 11/2004 | Tanghe et al. |
| 2004/0239596 A1 | 12/2004 | Ono et al. |
| 2004/0252089 A1 | 12/2004 | Ono et al. |
| 2004/0257355 A1 | 12/2004 | Naugler |
| 2004/0263437 A1 | 12/2004 | Hattori |
| 2005/0007357 A1 | 1/2005 | Yamashita et al. |
| 2005/0030267 A1 | 2/2005 | Tanghe et al. |
| 2005/0035709 A1 | 2/2005 | Furuie et al. |
| 2005/0067970 A1 | 3/2005 | Libsch et al. |
| 2005/0067971 A1 | 3/2005 | Kane |
| 2005/0068270 A1 | 3/2005 | Awakura et al. |
| 2005/0088085 A1 | 4/2005 | Nishikawa et al. |
| 2005/0088103 A1 | 4/2005 | Kageyama et al. |
| 2005/0110420 A1 | 5/2005 | Arnold et al. |
| 2005/0117096 A1 | 6/2005 | Voloschenko et al. |
| 2005/0140598 A1 | 6/2005 | Kim et al. |
| 2005/0140610 A1 | 6/2005 | Smith et al. |
| 2005/0145891 A1 | 7/2005 | Abe |
| 2005/0156831 A1 | 7/2005 | Yamazaki et al. |
| 2005/0168416 A1 | 8/2005 | Hashimoto et al. |
| 2005/0206590 A1 | 9/2005 | Sasaki et al. |
| 2005/0225686 A1 | 10/2005 | Brummack et al. |
| 2005/0260777 A1 | 11/2005 | Brabec et al. |
| 2005/0269959 A1 | 12/2005 | Uchino et al. |
| 2005/0269960 A1 | 12/2005 | Ono et al. |
| 2005/0285822 A1 | 12/2005 | Reddy et al. |
| 2005/0285825 A1 | 12/2005 | Eom et al. |
| 2006/0007072 A1 | 1/2006 | Choi et al. |
| 2006/0012310 A1 | 1/2006 | Chen et al. |
| 2006/0027807 A1 | 2/2006 | Nathan et al. |
| 2006/0030084 A1 | 2/2006 | Young |
| 2006/0038758 A1 | 2/2006 | Routley et al. |
| 2006/0044227 A1 | 3/2006 | Hadcock |
| 2006/0066527 A1 | 3/2006 | Chou |
| 2006/0092185 A1 | 5/2006 | Jo et al. |
| 2006/0232522 A1 | 10/2006 | Roy et al. |
| 2006/0261841 A1 | 11/2006 | Fish |
| 2006/0264143 A1 | 11/2006 | Lee et al. |
| 2006/0273997 A1 | 12/2006 | Nathan et al. |
| 2006/0284801 A1 | 12/2006 | Yoon et al. |
| 2007/0001937 A1 | 1/2007 | Park et al. |
| 2007/0001939 A1 | 1/2007 | Hashimoto et al. |

(56) References Cited

U.S. PATENT DOCUMENTS

| | | |
|---|---|---|
| 2007/0008268 A1 | 1/2007 | Park et al. |
| 2007/0008297 A1 | 1/2007 | Bassetti |
| 2007/0046195 A1 | 3/2007 | Chin et al. |
| 2007/0069998 A1 | 3/2007 | Naugler et al. |
| 2007/0080905 A1 | 4/2007 | Takahara |
| 2007/0080906 A1 | 4/2007 | Tanabe |
| 2007/0080908 A1 | 4/2007 | Nathan et al. |
| 2007/0080918 A1 | 4/2007 | Kawachi et al. |
| 2007/0103419 A1 | 5/2007 | Uchino et al. |
| 2007/0182671 A1 | 8/2007 | Nathan et al. |
| 2007/0273294 A1 | 11/2007 | Nagayama |
| 2007/0285359 A1 | 12/2007 | Ono |
| 2007/0296672 A1 | 12/2007 | Kim et al. |
| 2008/0042948 A1 | 2/2008 | Yamashita et al. |
| 2008/0055209 A1 | 3/2008 | Cok |
| 2008/0074413 A1 | 3/2008 | Ogura |
| 2008/0088549 A1 | 4/2008 | Nathan et al. |
| 2008/0122803 A1 | 5/2008 | Izadi et al. |
| 2008/0230118 A1 | 9/2008 | Nakatani et al. |
| 2009/0032807 A1 | 2/2009 | Shinohara et al. |
| 2009/0051283 A1 | 2/2009 | Cok et al. |
| 2009/0146930 A1* | 6/2009 | Nishimura ........ H01L 27/3262 345/80 |
| 2009/0160743 A1 | 6/2009 | Tomida et al. |
| 2009/0162961 A1 | 6/2009 | Deane |
| 2009/0174628 A1 | 7/2009 | Wang et al. |
| 2009/0213046 A1 | 8/2009 | Nam |
| 2010/0052524 A1 | 3/2010 | Kinoshita |
| 2010/0078230 A1 | 4/2010 | Rosenblatt et al. |
| 2010/0079711 A1 | 4/2010 | Tanaka |
| 2010/0097335 A1 | 4/2010 | Jung et al. |
| 2010/0133994 A1 | 6/2010 | Song et al. |
| 2010/0134456 A1 | 6/2010 | Oyamada |
| 2010/0156279 A1 | 6/2010 | Tamura et al. |
| 2010/0237374 A1 | 9/2010 | Chu et al. |
| 2010/0328294 A1 | 12/2010 | Sasaki et al. |
| 2011/0090210 A1 | 4/2011 | Sasaki et al. |
| 2011/0133636 A1 | 6/2011 | Matsuo et al. |
| 2011/0180825 A1 | 7/2011 | Lee et al. |
| 2012/0212468 A1 | 8/2012 | Govil |
| 2013/0009930 A1 | 1/2013 | Cho et al. |
| 2013/0032831 A1 | 2/2013 | Chaji et al. |
| 2013/0113785 A1 | 5/2013 | Sumi |
| 2013/0328040 A1* | 12/2013 | Yokoyama ............ C09K 11/06 257/40 |
| 2014/0346484 A1* | 11/2014 | Nendai ............... H01L 51/5228 257/40 |

FOREIGN PATENT DOCUMENTS

| | | |
|---|---|---|
| CA | 2 249 592 | 7/1998 |
| CA | 2 368 386 | 9/1999 |
| CA | 2 242 720 | 1/2000 |
| CA | 2 354 018 | 6/2000 |
| CA | 2 436 451 | 8/2002 |
| CA | 2 438 577 | 8/2002 |
| CA | 2 483 645 | 12/2003 |
| CA | 2 463 653 | 1/2004 |
| CA | 2498136 | 3/2004 |
| CA | 2522396 | 11/2004 |
| CA | 2443206 | 3/2005 |
| CA | 2472671 | 12/2005 |
| CA | 2567076 | 1/2006 |
| CA | 2526782 | 4/2006 |
| CN | 1381032 | 11/2002 |
| CN | 1448908 | 10/2003 |
| DE | 20 2006 005427 | 6/2006 |
| EP | 0 940 796 | 9/1999 |
| EP | 1 028 471 A | 8/2000 |
| EP | 1 103 947 | 5/2001 |
| EP | 1 130 565 A1 | 9/2001 |
| EP | 1 184 833 | 3/2002 |
| EP | 1 194 013 | 4/2002 |
| EP | 1 310 939 | 5/2003 |
| EP | 1 335 430 A1 | 8/2003 |
| EP | 1 372 136 | 12/2003 |
| EP | 1 381 019 | 1/2004 |
| EP | 1 418 566 | 5/2004 |
| EP | 1 429 312 A | 6/2004 |
| EP | 1 439 520 | 7/2004 |
| EP | 1 465 143 A | 10/2004 |
| EP | 1 467 408 | 10/2004 |
| EP | 1 517 290 | 3/2005 |
| EP | 1 521 203 A2 | 4/2005 |
| EP | 2317499 | 5/2011 |
| GB | 2 205 431 | 12/1988 |
| JP | 09 090405 | 4/1997 |
| JP | 10-153759 | 6/1998 |
| JP | 10-254410 | 9/1998 |
| JP | 11 231805 | 8/1999 |
| JP | 11-282419 | 10/1999 |
| JP | 2000/056847 | 2/2000 |
| JP | 2000-077192 | 3/2000 |
| JP | 2000-089198 | 3/2000 |
| JP | 2000-352941 | 12/2000 |
| JP | 2002-91376 | 3/2002 |
| JP | 2002-268576 | 9/2002 |
| JP | 2002-278513 | 9/2002 |
| JP | 2002-333862 | 11/2002 |
| JP | 2003-022035 | 1/2003 |
| JP | 2003-076331 | 3/2003 |
| JP | 2003-150082 | 5/2003 |
| JP | 2003-177709 | 6/2003 |
| JP | 2003-271095 | 9/2003 |
| JP | 2003-308046 | 10/2003 |
| JP | 2005-057217 | 3/2005 |
| JP | 2006065148 | 3/2006 |
| JP | 2009282158 | 12/2009 |
| TW | 485337 | 5/2002 |
| TW | 502233 | 9/2002 |
| TW | 538650 | 6/2003 |
| TW | 569173 | 1/2004 |
| WO | WO 94/25954 | 11/1994 |
| WO | WO 99/48079 | 9/1999 |
| WO | WO 01/27910 A1 | 4/2001 |
| WO | WO 02/067327 A | 8/2002 |
| WO | WO 03/034389 A | 4/2003 |
| WO | WO 03/063124 | 7/2003 |
| WO | WO 03/077231 | 9/2003 |
| WO | WO 03/105117 | 12/2003 |
| WO | WO 2004/003877 | 1/2004 |
| WO | WO 2004/034364 | 4/2004 |
| WO | WO 2005/022498 | 3/2005 |
| WO | WO 2005/029455 | 3/2005 |
| WO | WO 2005/055185 | 6/2005 |
| WO | WO 2006/053424 | 5/2006 |
| WO | WO 2006/063448 A | 6/2006 |
| WO | WO 2006/137337 | 12/2006 |
| WO | WO 2007/003877 A | 1/2007 |
| WO | WO 2007/079572 | 7/2007 |
| WO | WO 2010/023270 | 3/2010 |

OTHER PUBLICATIONS

Alexander et al.: "Pixel circuits and drive schemes for glass and elastic AMOLED displays"; dated Jul. 2005 (9 pages).

Alexander et al.: "Unique Electrical Measurement Technology for Compensation, Inspection, and Process Diagnostics of AMOLED HDTV"; dated May 2010 (4 pages).

Ashtiani et al.: "AMOLED Pixel Circuit With Electronic Compensation of Luminance Degradation"; dated Mar. 2007 (4 pages).

Chaji et al.: "A Current-Mode Comparator for Digital Calibration of Amorphous Silicon AMOLED Displays"; dated Jul. 2008 (5 pages).

Chaji et al.: "A fast settling current driver based on the CCII for AMOLED displays"; dated Dec. 2009 (6 pages).

Chaji et al.: "A Low-Cost Stable Amorphous Silicon AMOLED Display with Full V~T- and V~O~L~E~D Shift Compensation"; dated May 2007 (4 pages).

Chaji et al.: "A low-power driving scheme for a-Si:H active-matrix organic light-emitting diode displays"; dated Jun. 2005 (4 pages).

Chaji et al.: "A low-power high-performance digital circuit for deep submicron technologies"; dated Jun. 2005 (4 pages).

(56) References Cited

OTHER PUBLICATIONS

Chaji et al.: "A novel a-Si:H AMOLED pixel circuit based on short-term stress stability of a-Si:H TFTs"; dated Oct. 2005 (3 pages).
Chaji et al.: "A Novel Driving Scheme and Pixel Circuit for AMOLED Displays"; dated Jun. 2006 (4 pages).
Chaji et al.: "A novel driving scheme for high-resolution large-area a-Si:H AMOLED displays"; dated Aug. 2005 (4 pages).
Chaji et al.: "A Stable Voltage-Programmed Pixel Circuit for a-Si:H AMOLED Displays"; dated Dec. 2006 (12 pages).
Chaji et al.: "A Sub-μA fast-settling current-programmed pixel circuit for AMOLED displays"; dated Sep. 2007.
Chaji et al.: "An Enhanced and Simplified Optical Feedback Pixel Circuit for AMOLED Displays"; dated Oct. 2006.
Chaji et al.: "Compensation technique for DC and transient instability of thin film transistor circuits for large-area devices"; dated Aug. 2008.
Chaji et al.: "Driving scheme for stable operation of 2-TFT a-Si AMOLED pixel"; dated Apr. 2005 (2 pages).
Chaji et al.: "Dynamic-effect compensating technique for stable a-Si:H AMOLED displays"; dated Aug. 2005 (4 pages).
Chaji et al.: "Electrical Compensation of OLED Luminance Degradation"; dated Dec. 2007 (3 pages).
Chaji et al.: "eUTDSP: a design study of a new VLIW-based DSP architecture"; dated My 2003 (4 pages).
Chaji et al.: "Fast and Offset-Leakage Insensitive Current-Mode Line Driver for Active Matrix Displays and Sensors"; dated Feb. 2009 (8 pages).
Chaji et al.: "High Speed Low Power Adder Design With a New Logic Style: Pseudo Dynamic Logic (SDL)"; dated Oct. 2001 (4 pages).
Chaji et al.: "High-precision, fast current source for large-area current-programmed a-Si flat panels"; dated Sep. 2006 (4 pages).
Chaji et al.: "Low-Cost AMOLED Television with IGNIS Compensating Technology"; dated May 2008 (4 pages).
Chaji et al.: "Low-Cost Stable a-Si:H AMOLED Display for Portable Applications"; dated Jun. 2006 (4 pages).
Chaji et al.: "Low-Power Low-Cost Voltage-Programmed a-Si:H AMOLED Display"; dated Jun. 2008 (5 pages).
Chaji et al.: "Merged phototransistor pixel with enhanced near infrared response and flicker noise reduction for biomolecular imaging"; dated Nov. 2008 (3 pages).
Chaji et al.: "Parallel Addressing Scheme for Voltage-Programmed Active-Matrix OLED Displays"; dated May 2007 (6 pages).
Chaji et al.: "Pseudo dynamic logic (SDL): a high-speed and low-power dynamic logic family"; dated 2002 (4 pages).
Chaji et al.: "Stable a-Si:H circuits based on short-term stress stability of amorphous silicon thin film transistors"; dated May 2006 (4 pages).
Chaji et al.: "Stable Pixel Circuit for Small-Area High-Resolution a-Si:H AMOLED Displays"; dated Oct. 2008 (6 pages).
Chaji et al.: "Stable RGBW AMOLED display with OLED degradation compensation using electrical feedback"; dated Feb. 2010 (2 pages).
Chaji et al.: "Thin-Film Transistor Integration for Biomedical Imaging and AMOLED Displays"; dated 2008 (177 pages).
European Search Report and Written Opinion for Application No. 08 86 5338 mailed Nov. 2, 2011 (7 pages).
European Search Report for European Application No. EP 04 78 6661 dated Mar. 9, 2009.
European Search Report for European Application No. EP 05 75 9141 dated Oct. 30, 2009.
European Search Report for European Application No. EP 05 82 1114 dated Mar. 27, 2009 (2 pages).
European Search Report for European Application No. EP 07 71 9579 dated May 20, 2009.
European Search Report mailed Mar. 26, 2012 in corresponding European Patent Application No. 10000421.7 (6 pages).

Extended European Search Report mailed Apr. 27, 2011 issued during prosecution of European patent application No. 09733076.5 (13 pages).
Goh et al., "A New a-Si:H Thin Film Transistor Pixel Circul for Active-Matrix Organic Light-Emitting Diodes", IEEE Electron Device Letters, vol. 24, No. 9, Sep. 2003, 4 pages.
International Search Report for International Application No. PCT/CA02/00180 dated Jul. 31, 2002 (3 pages).
International Search Report for International Application No. PCT/CA2004/001741 dated Feb. 21, 2005.
International Search Report for International Application No. PCT/CA2005/001844 dated Mar. 28, 2006 (2 pages).
International Search Report for International Application No. PCT/CA2005/001007 dated Oct. 18, 2005.
International Search Report for International Application No. PCT/CA2007/000652 dated Jul. 25, 2007.
International Search Report for International Application No. PCT/CA2008/002307, mailed Apr. 28, 2009 (3 pages).
International Search Report for International Application No. PCT/IB2011/055135, Canadian Patent Office, dated Apr. 16, 2012 (5 pages).
International Search Report mailed Jul. 30, 2009 for International Application No. PCT/CA2009/000501 (4 pages).
Jafarabadiashtiani et al.: "A New Driving Method for a-Si AMOLED Displays Based on Voltage Feedback"; dated 2005 (4 pages).
Lee et al.: "Ambipolar Thin-Film Transistors Fabricated by PECVD Nanocrystalline Silicon"; dated 2006 (6 pages).
Ma e y et al: "Organic Light-Emitting Diode/Thin Film Transistor Integration for foldable Displays" Conference record of the 1997 International display research conference and international workshops on LCD technology and emissive technology. Toronto, Sep. 15-19, 1997 (6 pages).
Matsueda y et al.: "35.1: 2.5-in. AMOLED with Integrated 6-bit Gamma Compensated Digital Data Driver"; dated May 2004.
Nathan et al.: "Backplane Requirements for Active Matrix Organic Light Emitting Diode Displays"; dated 2006 (16 pages).
Nathan et al.: "Call for papers second international workshop on compact thin-film transistor (TFT) modeling for circuit simulation"; dated Sep. 2009 (1 page).
Nathan et al.: "Driving schemes for a-Si and LTPS AMOLED displays"; dated Dec. 2005 (11 pages).
Nathan et al.: "Invited Paper: a-Si for AMOLED—Meeting the Performance and Cost Demands of Display Applications (Cell Phone to HDTV)"; dated 2006 (4 pages).
Nathan et al.: "Thin film imaging technology on glass and plastic" ICM 2000, Proceedings of the 12$^{th}$ International Conference on Microelectronics, (IEEE Cat. No. 00EX453), Tehran Iran; dated Oct. 31-Nov. 2, 2000, pp. 11-14, ISBN: 964-360-057-2, p. 13, col. 1, line 11-48; (4 pages).
Nathan et al., "Amorphous Silicon Thin Film Transistor Circuit Integration for Organic LED Displays on Glass and Plastic", IEEE Journal of Solid-State Circuits, vol. 39, No. 9, Sep. 2004, pp. 1477-1486.
Office Action issued in Chinese Patent Application 200910246264.4 Dated Jul. 5, 2013; 8 pages.
Patent Abstracts of Japan, vol. 2000, No. 09, Oct. 13, 2000-JP 2000 172199 A, Jun. 3, 2000, abstract.
Patent Abstracts of Japan, vol. 2002, No. 03, Apr. 3, 2002 (Apr. 4, 2004 & JP 2001 318627 A (Semiconductor EnergyLab DO LTD), Nov. 16, 2001, abstract, paragraphs '01331-01801, paragraph '01691, paragraph '01701, paragraph '01721 and figure 10.
Philipp: "Charge transfer sensing" SENSOR REVIEW, vol. 19, No. 2, Dec. 31, 1999 (Dec. 31, 1999), 10 pages.
Rafati et al.: "Comparison of a 17 b multiplier in Dual-rail domino and in Dual-rail D L (D L) logic styles"; dated 2002 (4 pages).
Safavaian et al.: "Three-TFT image sensor for real-time digital X-ray imaging"; dated Feb. 2, 2006 (2 pages).
Safavian et al.: "3-TFT active pixel sensor with correlated double sampling readout circuit for real-time medical x-ray imaging"; dated Jun. 2006 (4 pages).

(56) References Cited

OTHER PUBLICATIONS

Safavian et al.: "A novel current scaling active pixel sensor with correlated double sampling readout circuit for real time medical x-ray imaging"; dated May 2007 (7 pages).
Safavian et al.: "A novel hybrid active-passive pixel with correlated double sampling CMOS readout circuit for medical x-ray imaging"; dated May 2008 (4 pages).
Safavian et al.: "Self-compensated a-Si:H detector with current-mode readout circuit for digital X-ray fluoroscopy"; dated Aug. 2005 (4 pages).
Safavian et al.: "TFT active image sensor with current-mode readout circuit for digital x-ray fluoroscopy [5969D-82]"; dated Sep. 2005 (9 pages).
Sanford, James L., et al., "4.2 TFT AMOLED Pixel Circuits and Driving Methods", SID 03 Digest, ISSN/0003, 2003, pp. 10-13.
Stewart M. et al., "Polysilicon TFT technology for active matrix OLED displays" IEEE transactions on electron devices, vol. 48, No. 5; Dated May, 2001 (7 pages).
Tatsuya Sasaoka et al., 24.4L; Late-News Paper: A 13.0-inch AM-Oled Display with Top Emitting Structure and Adaptive Current Mode Programmed Pixel Circuit (TAC)', SID 01 Digest, (2001), pp. 384-387.

Vygranenko et al.: "Stability of indium-oxide thin-film transistors by reactive ion beam assisted deposition"; dated 2009.
Wang et al.: "Indium oxides by reactive ion beam assisted evaporation: From material study to device application"; dated Mar. 2009 (6 pages).
Written Opinion mailed Jul. 30, 2009 for International Application No. PCT/CA2009/000501 (6 pages).
Yi He et al., "Current-Source a-Si:H Thin Film Transistor Circuit for Active-Matrix Organic Light-Emitting Displays", IEEE Electron Device Letters, vol. 21, No. 12, Dec. 2000, pp. 590-592.
Zhiguo Meng et al; "24.3: Active-Matrix Organic Light-Emitting Diode Display implemented Using Metal-Induced Unilaterally Crystallized Polycrystalline Silicon Thin-Film Transistors", SID 01Digest, (2001), pp. 380-383.
International Search Report for Application No. PCT/IB2014/059409, Canadian Intellectual Property Office, dated Jun. 12, 2014 (4 pages).
Written Opinion for Application No. PCT/IB2014/059409, Canadian Intellectual Property Office, dated Jun. 12, 2014 (5 pages).
Extended European Search Report for Application No. EP 14181848.4, mailed Mar. 5, 2015, (9 pages).

\* cited by examiner

ELECTRODE CONTACTS

CROSS REFERENCE TO RELATED APPLICATION

This application claims the benefit of U.S. Provisional Patent Application Nos. 61/929,699, filed Jan. 21, 2014, and 61/920,732, filed Dec. 25, 2013, each of which is hereby incorporated by reference in its entirety.

TECHNICAL FIELD

In array devices with a common-electrode, the resistance of the common electrode can affect the quality of the device performance. In the case of top emission displays, the top electrode needs to be transparent. One method to fabricate a transparent electrode is to use very thin electrodes. However, this results in higher resistivity which can be an issue for large area devices. In one method, the top electrode can be contacted to a conductive layer. However, developing a contact opening is very challenging since a shadow mask needs to be used to remove the semiconductor layer from the opening.

Thus, there is a need of developing contact to conductive layers without using a shadow mask for common-electrode devices. There is also a need to reduce the resistivity of an electrode to prevent a large voltage drop in a device.

SUMMARY

According to one example, a device structure providing contact to conductive layers via a deep trench structure is disclosed. The device structure includes a first dielectric layer including a first opening. The first opening has walls on the first dielectric layer. A first conductive layer is deposited over the first dielectric layer and the first opening. A second dielectric layer is deposited on the first conductive layer. The second dielectric layer includes a second opening having walls on the second dielectric layer. A second conductive layer is deposited over the second dielectric layer and the first and second openings. A semiconductor layer is deposited on the second conductive layer such that the semiconductor layer is not continuous on at least part of the walls of the first or second openings. A top electrode layer is deposited on the semiconductor layer. The top electrode layer is in contact with the second conductive layer on at least part of the walls of the first or second openings.

Another example is a method of method of fabricating a device structure providing contact to conductive layers via a deep trench structure. The method includes depositing a first dielectric layer and creating a first opening in the first dielectric layer. The first opening has walls on the first dielectric layer. A first conductive layer is deposited over the first dielectric layer and the first opening. A second dielectric layer is deposited on the first conductive layer. A second opening is created on the second dielectric layer. The second opening has walls on the second dielectric layer. A second conductive layer is deposited over the second dielectric layer and the first and second openings. A semiconductor layer is deposited on the second conductive layer such that the semiconductor layer is not continuous on at least part of the walls of the first or second opening. A top electrode layer is deposited on the semiconductor layer. The top electrode is in contact with the second conductive layer on at least part of the walls of the first or second opening.

Another example is a low resistance device including a backplane layer and a low resistance conductor layer having a pattern with a plurality of edges on the backplane layer. A semiconductor layer is deposited on the low resistance conductor layer. A high-resistance top conductor layer is deposited on the semiconductor layer. The high-resistance top conductor layer is in contact with the low resistance conductor layer on at least one of the plurality of edges.

Another example is a method of forming a low resistance device. The method includes forming a backplane and depositing a low-resistance conductive layer on the backplane. The low-resistance conductive layer is patterned to create a plurality of edges in the low-resistance conductive layer. A semiconductor layer is deposited on the low resistance conductor layer. A high-resistance top conductor layer is deposited on the semiconductor layer. The high-resistance top conductor layer is in contact with the low resistance conductor layer on at least one of the plurality of edges.

Additional aspects of the invention will be apparent to those of ordinary skill in the art in view of the detailed description of various embodiments, which is made with reference to the drawings, a brief description of which is provided below.

BRIEF DESCRIPTION OF THE DRAWINGS

The foregoing and other advantages of the invention will become apparent upon reading the following detailed description and upon reference to the drawings.

Figure 1:
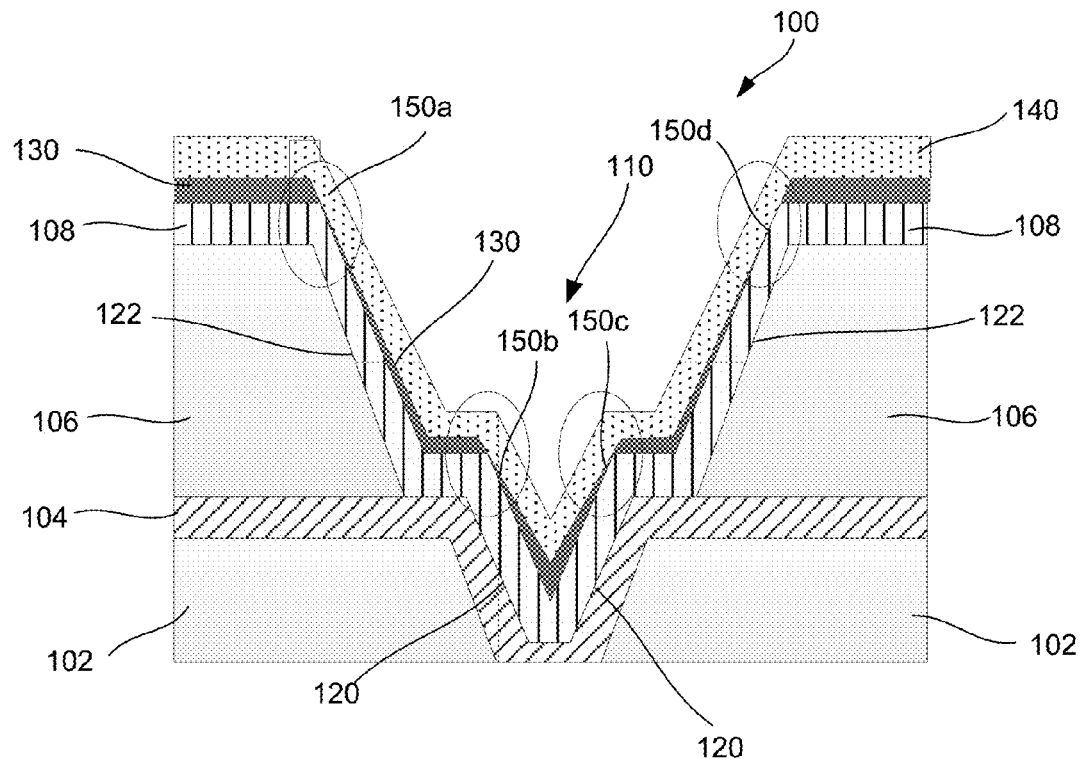
FIG. 1 is a cross-sectional view of a semiconductor device structure with contacts to a common electrode.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

FIG. 1 is a cross-section view of an example structure to allow connection of a top electrode to electrodes. The structure 100 in FIG. 1 may be part of a semi-conductor device including transistors and other components requiring electrical connection. The structure 100 includes a first dielectric layer 102. A first conductive layer 104 is formed on the first dielectric layer 102. A second dielectric layer 106 is formed on the first conductive layer 104. A deep trench 110 is formed in the dielectric layers 102 and 106. A second conductive layer 108 is formed over the second dielectric layer 106.

As may be seen in FIG. 1, the trench 110 bisects the first dielectric layer 102 and the conductive layer 102 is located over sidewalls 120 of the first dielectric layer 102. The second conductive layer 108 is located over sidewalls 122 of the second dielectric layer 106 and also may be in contact with the first conductive layer 104.

A semiconductor layer 130 may be fabricated over the second conductive layer 108 and partially over the walls of the trench 110 that are covered by the second conductive layer 108. A top electrode layer 140 is formed over the semiconductor layer 130. The electrode layer 140 is formed on the walls of the trench 110. The electrode layer 140 contacts the second conductive layer 108 at certain points on the walls of the trench 110 such as at contact points 150a, 150b, 150c and 150d in this example.

In most of the cases, one of the dielectric layers 102 or 106 can be used as the deep trench 110. A deep opening is created by the trench 110 so it causes a discontinuity in the semiconductor (or selected dielectric) layer 130. For example, in top emission displays, one of the dielectric layers acts as a planarization layer which needs to be very thick as shown by the second dielectric layer 106. Thus, this layer is a good candidate for the deep trench structure. To create an even deeper trench, multiple stacked openings in the backplane can be used. For example, FIG. 1 shows a deep trench created in the backplane by using two openings. To create the openings, different patterning techniques such as lithography, liftoff, or molding, shadow masking and/or other techniques can be used.

For depositing the dielectric, conductive and semiconductor layers, different techniques such as plasma enhanced chemical vapor deposition (PECVD), chemical vapor deposition (CVD), sputtering, vapor deposition, printing, spin coating, spray coating, and others can be used.

Figure 2A:
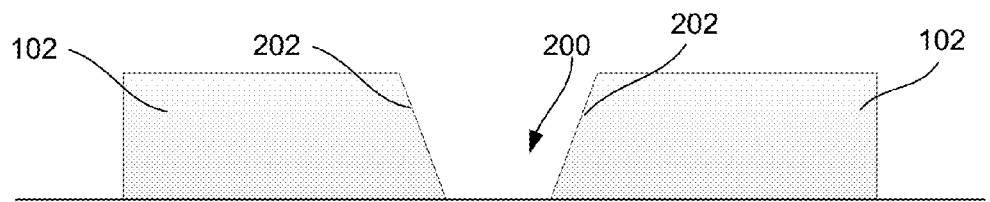
FIGS. 2A-2G are diagrams showing the process of fabricating the device structure in FIG. 1.

One example of developing a deep trench connection in a structure 100 using multiple dielectric layers is shown in FIGS. 2A-2F as described below. FIG. 2A shows the deposition of the dielectric layer 102. In this example, the dielectric layer 102 may be a material such as Silicon-Nitride which is deposited on top of existing structure on the backplane. This may be one of the backplane dielectric layers or an extra layer. An opening 200 in the dielectric layer 102 in the position of the eventual deep-trench 110 in FIG. 1 using photolithography. The opening 200 is driven to depth of the backplane and therefore creates sidewalls 202.

Figure 2B:
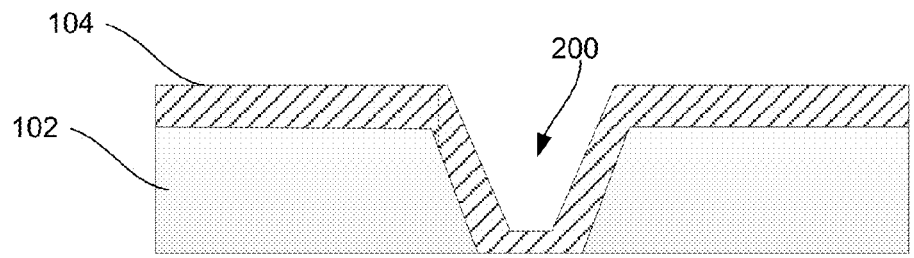

The conductive layer 104 is then deposited over the remaining dielectric layer 102 as shown in FIG. 2B. The conductive layer 104 is deposited over the flat top surfaces of the dielectric layer 102 and the sidewalls 202. The conductive layer 104 may be one of the backplane conductive layers or an extra layer. In this example, the conductive layer 104 is patterned as required by the design (a pattern should be left on top of the opening 200).

Figure 2C:
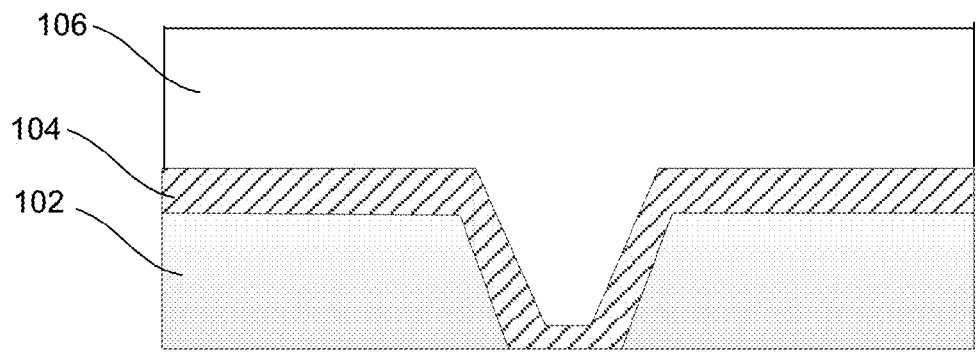

FIG. 2C shows the deposition of the second dielectric layer 106 over the conductive layer 104. The second dielectric layer 106 may be a polymer layer deposited by spin (spray or printing) coating, or it may be a stack of non-organic and polymer layers or non-organic only). This layer can be one of the layers required for the display structure such as planarization layer, or it can be an extra layer added only for the trench development. In this example, the second dielectric layer 106 is relatively thick, thus allowing the creating of the deep trench 110. The second dielectric layer 106 may be patterned using conventional photolithography (molding or other techniques can be used as well). The pattern of the second dielectric layer 106 includes a second opening in the position of the deep trench 110.

Figure 2D:
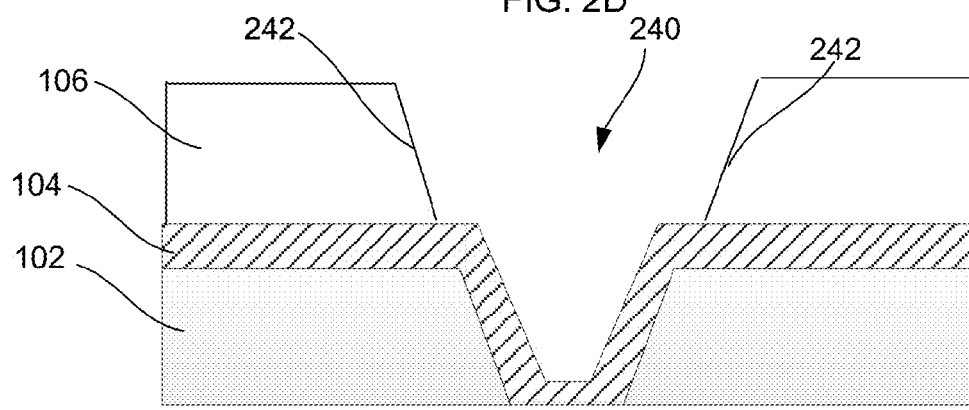

FIG. 2D shows the creation of a second opening 240 which is formed through patterning the second dielectric layer 106. The second opening 240 allows sidewalls 242 to be formed in the second dielectric layer 106. The second opening 240 allows the second dielectric layer 106 to be removed so the conductive layer 104 is exposed. The second opening 240 thus creates trench walls 122 shown in FIG. 1. The combination of the first opening 200 and the second opening 240 create the deep trench 110 and corresponding side walls 120 and 122 in FIG. 1.

Figure 2E:
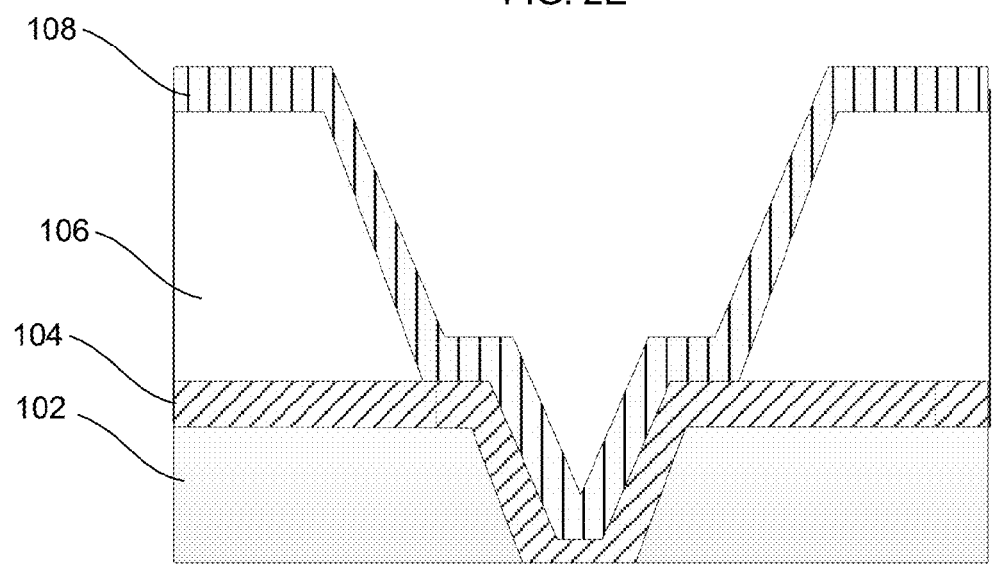

FIG. 2E shows the deposition of the second conductive layer 108 over the trench created in the second dielectric layer 106. The second conductive layer 108 may be one of the display conductive layers such as the OLED anode layer or an extra layer added for the deep trench development. The conductive layer 108 is patterned as required by the design of the device structure. The pattern of the conductive layer 108 includes leaving the conductive layer 108 on the first opening 200.

Figure 2F:
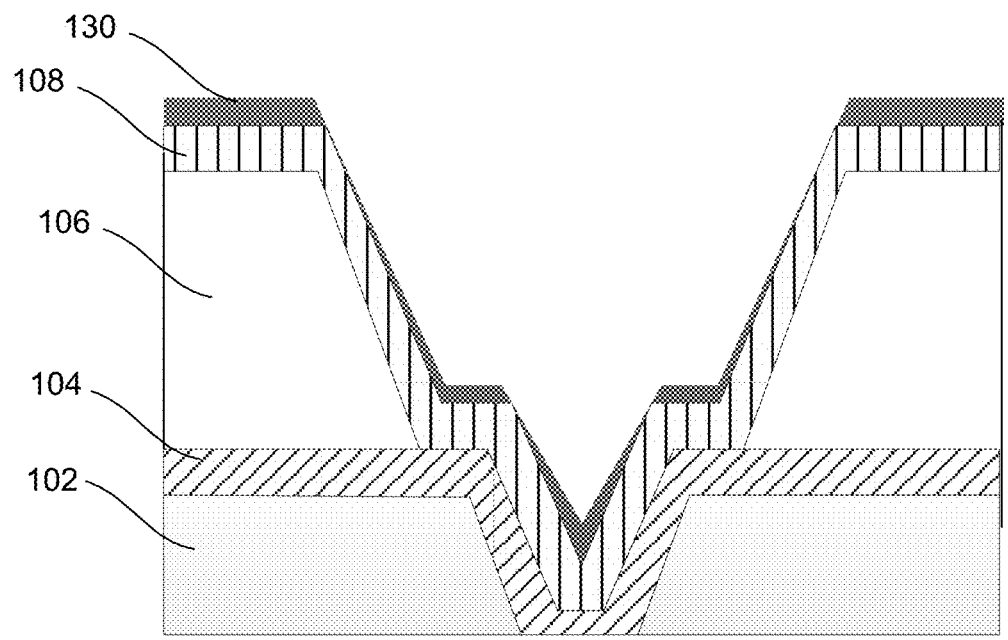

FIG. 2F shows the deposition of the semiconductor layer 130 on the second conductive layer 108. The semiconductor layer 130 may be an OLED structure or other thin film device structure. The semiconductor layer 130 may be deposited with different techniques such as vapor deposition, printing, etc. Since the semiconductor layer 130 is very thin compared to the depth of the trench 110 and the walls 122 of the trench are steep, there will be a discontinuity such as the contact point 150a in the semiconductor layer 130 on the walls 122 and edge of the trench 110.

Figure 2G:
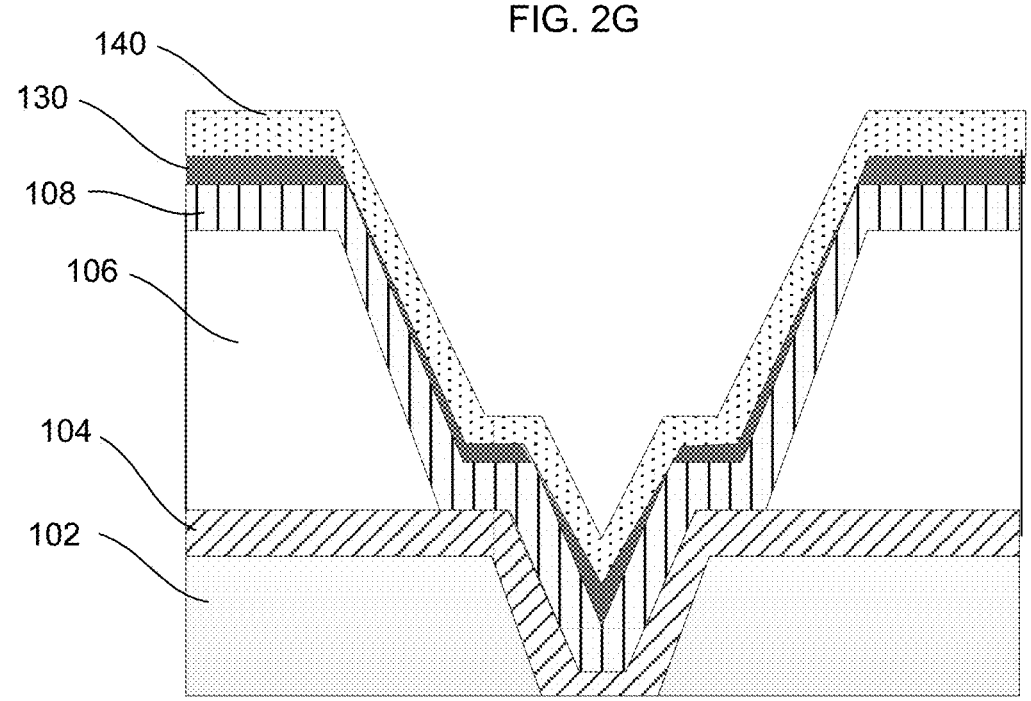

FIG. 2G shows the deposition of the top electrode 140. The top electrode 140 connects to the second conductive layer 108 at the discontinuity areas of the semiconductor layer 130. FIG. 1 shows a number of discontinuity areas 150a, 150b, 150c and 150d which allow contact between the top electrode 140 and the second conductive layer 108.

In the case of a deep trench, the semiconductor (or a dielectric) layer 130 is discontinued at the edges (or walls of the trench). Therefore, after depositing the top electrode 140, the top electrode 140 is connected to the conductive layers 108 at the walls of the trench 110. In this manner, a shadow mask may be avoided to create the contact since the semiconductor layer has discontinuities due to the trench that allows contact.

Figure 3:
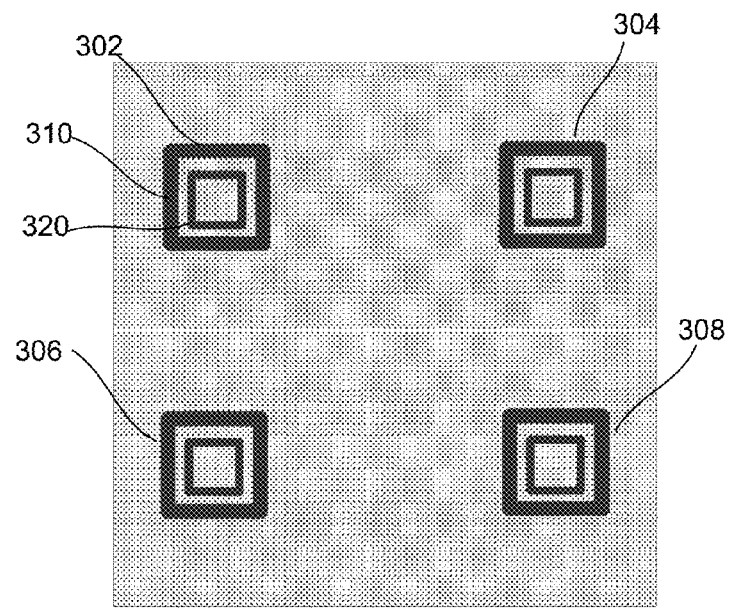
FIG. 3 is a top plan view of the common electrodes in several of the devices having a structure as shown in FIG. 1, showing the contact areas to the conductive layers in each device.

FIG. 3 demonstrates a top view of a device 300 that includes top electrodes 302, 304, 306 and 308. Each of the top electrodes are fabricated in the process described above. The top electrode 302 includes an outer contact area 310 which corresponds to the trench walls in FIG. 1. The outer contact area 310 is at the edge of the trench structure where there is a discontinuity of the semiconductor layer 130 in FIG. 1. An inner contact area 320 also provides contact to the electrode 108 at a discontinuity of the semiconductor layer 130 in FIG. 1. Thus, the top electrodes 302, 304, 306 and 308 are connected to the conductive layers at the discontinuity areas of the semiconductor layers in a trench 110.

When there are thin layers of semiconductor (dielectric) between two conductive layers to form a device, a dielectric layer is used to cover the edge of the bottom conductive layer. For example, an OLED can consist of thin organic layers (with a total thickness of a few 100 nm) which are sandwiched between two conductive layers (at least one of which is transparent). Since the thickness of the bottom conductive layer is significantly more than that of the organic layers, to avoid any short, a dielectric is deposited on the bottom electrode and is patterned in a way that covers the edge of the bottom electrode and leaves the center of the electrode exposed for organic layers.

In some cases, the resistance for one of the conductive layers (electrode) is high, causing a significant voltage drop in the case of an array structure. For example, in the case of a top-emission OLED, the top electrode is transparent and is made of very thin conductive layers.

Figure 4:
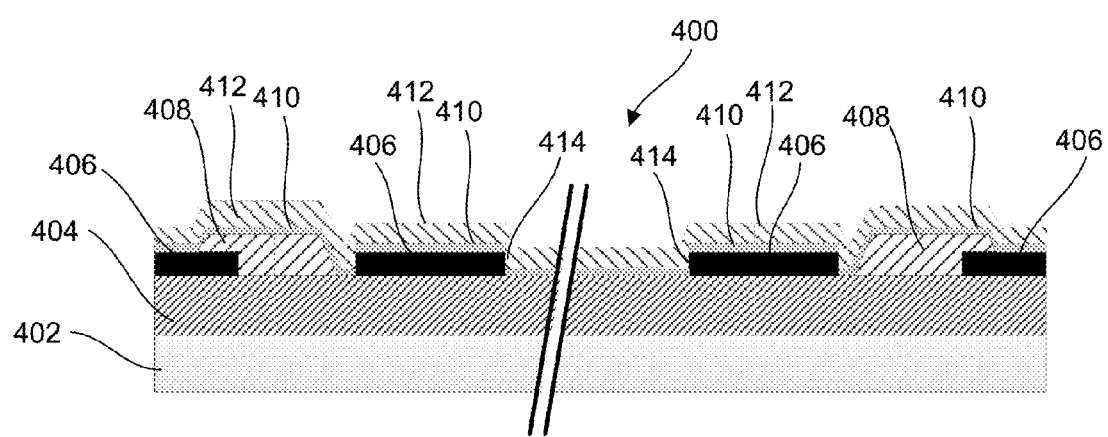
FIG. 4 is a sectional view of a crossing structure for improving the resistance of an electrode.

In order to prevent a significant voltage drop, a lower resistance conductive material may be used before depositing the semiconductor layers. FIG. 4 shows a cross section of a device structure 400 that avoids a significant voltage drop from resistance of one of the conductive layers. In this example, a substrate 402 supports a dielectric layer 404 which serves as a backplane of the device structure 400. The dielectric layer 404 may have numerous other layers that make up the backplane of the device. A series of lower resistance conductive strips 406 is formed on the dielectric layer 404. In this example, the lower resistance conductive strips 406 are patterned such that they have numerous edges. A dielectric layer 408 is formed on some of the conductive strips 406. A thin semiconductor layer 410 which may be an organic material is formed over the horizontal surfaces of the low resistance conductive strips 406 and the dielectric layers 408. As may be seen in FIG. 4, the edges of the lower resistance conductive strips 406 remain exposed and not covered by the semiconductor layer. A top conductive layer 412 is then applied which in this example is transparent but has a high resistance. The top conductive layer 412 is in contact with the lower resistance conductive strips 406 on an edge such as on edges 414 thus shorting out the top conductive layer 412 and lowering the resistance of the contact.

The process of creating the structure in FIG. 4 is based on using lower resistance conductive material for the conductive strips 406 before depositing the semiconductor (dielectric) layers. A low-resistance conductive layer (or stack of conductive layers) is deposited which is thicker than the main semiconductor (dielectric) layers being deposited on top of it. This may be one of the conductive layers existing in the device or a new one added just for this reason. The low resistance conductive layer is then patterned. The pattern should create more edges. For example, stripes such as shown in FIGS. 4 and 5A or a mesh shown in FIG. 5B may create numerous edges.

If there are other layers before the main semiconductor layer, they should be patterned after deposition to leave the edges exposed. For example, in FIG. 4, the dielectric layers 408 are patterned on the low resistance conductive strips 406. The main semiconductor (dielectric) layer 410 is then deposited and patterned as needed by the design. The high-resistance conductive layer 412 is then deposited and patterned as needed. The pattern covers the low-resistance area of the conductive strips 406 and, more importantly, at least one of its edges. The fabrication of device is continued until all the other required layers after this high-resistance conductive layer are deposited and patterned.

The edge or low-resistance conductive material cannot be covered by the main semiconductor (dielectric) since the thickness of the conductive layer is greater than that of the main layer. The high-resistance conductive layer will be shorted to the exposed edge of the low-resistance conductive layer.

Figure 5A:
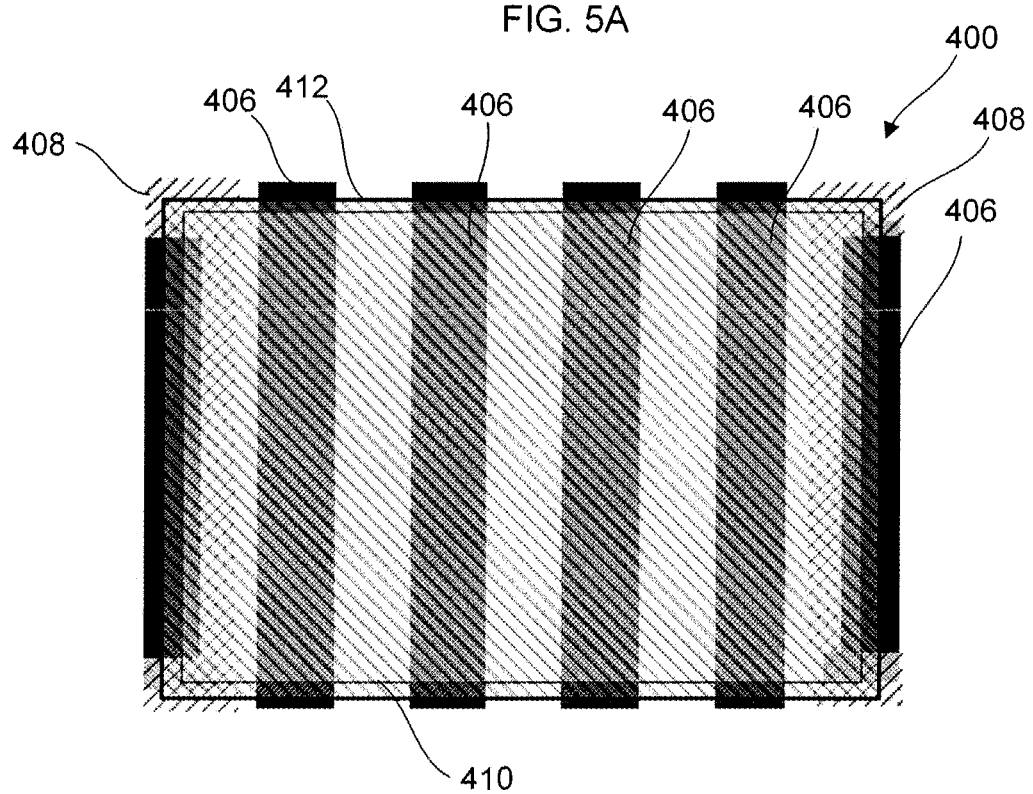
FIG. 5A is a side elevation of a crossing structure for improving the resistance with strip patterning.
Figure 5B:
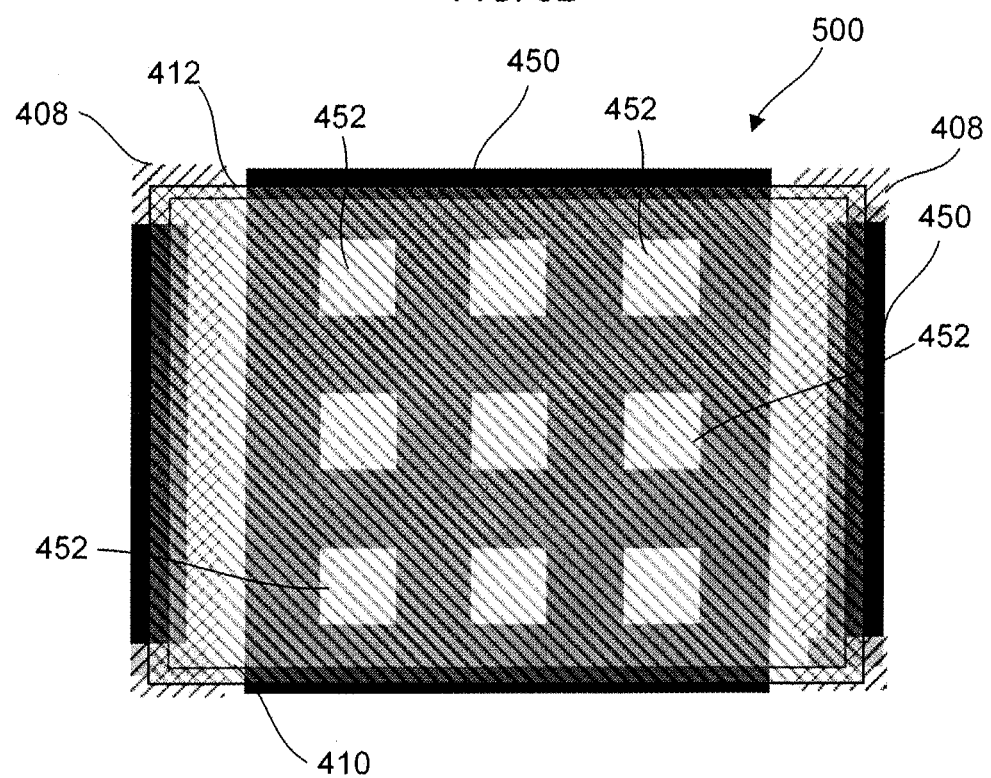
FIG. 5B is a side elevation of another crossing structure for improving the resistance with mesh patterning.

FIGS. 5A and 5B are top plan views of examples of the structure that incorporates the low resistance conductive layers. FIG. 5A shows a top view of the device structure 400 in FIG. 4. The top conductive layer 412 is a transparent layer with high resistance. Since the top conductive layer 412 is deposited over the low resistance conductive strips 406, it contacts the edges of the strips 406 and is shorted to prevent high resistance. The semiconductor layer 410 is fabricated over the conductive strips as well as other layers 408.

FIG. 5B is a top view of another device structure 500 that has the same top conductive layer 412, semiconductor layer 410 and other layers 408 as the structure 400 in FIG. 4. A low resistive conductive layer 450 is patterned in a mesh structure. The low resistive conductive layer 450 has a series of openings 452 that have multiple edges to create contact with the high resistance top conductive layer 412 thus shorting the top conductive layer 412.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

What is claimed is:

1. A device structure providing contact to conductive layers via a deep trench structure, the device structure comprising:

a first dielectric layer including a flat top surface around a first opening, the first opening having walls on the first dielectric layer;

a first conductive layer deposited over the flat top surface and the first opening of the first dielectric layer;

a second dielectric layer deposited on the first conductive layer, the second dielectric layer including a flat top surface around a second opening having walls on the second dielectric layer, wherein the first conductive layer is located between the first and second dielectric layer;

a second conductive layer deposited over the second dielectric layer and the first and second openings;

a semiconductor layer deposited on the second conductive layer, the semiconductor layer being continuous on the flat top surface of the first and second dielectric layers, the semiconductor layer continuously covering a lower portion of the walls of the first and second openings, and being discontinuous on an upper portion of the walls between the lower portion of the walls and the flat top surfaces; and a top electrode layer deposited on the semiconductor layer, the top electrode layer in contact with the second conductive layer on the upper portion of the walls of the first or second openings.

2. The device structure of claim 1, wherein the first and second openings are created by one of lithography, liftoff, molding or shadow masking.

3. The device structure of claim 1, wherein the semiconductor layer is an organic light emitting diode.

4. The device structure of claim 1, wherein the first dielectric layer is silicon-nitride and the second dielectric layer is a polymer.

5. The device structure of claim 1, wherein the first and second dielectric layers, the first and second conductive layers and the semiconductor layer are deposited via at least one of PECVD, CVD, sputtering, vapor deposition, printing, spin coating, and spray coating.

6. A method of fabricating a device structure providing contact to conductive layers via a deep trench structure, the method comprising:

depositing a first dielectric layer having a flat top surface;

creating a first opening in the flat top surface of the first dielectric layer, the first opening having walls on the first dielectric layer;

depositing a first conductive layer over the flat top surface and the first opening of the first dielectric layer;

depositing a second dielectric layer having a flat top surface on the first conductive layer;

creating a second opening on the flat top surface of the second dielectric layer, the second opening having walls on the second dielectric layer, and wherein the first conductive layer is located between the first and second dielectric layers;

depositing a second conductive layer over the second dielectric layer and the first and second openings;

depositing a semiconductor layer on the second conductive layer, the semiconductor layer being continuous on the flat top surface of the first and second dielectric layers, the semiconductor layer continuously covering a lower portion of the walls of the first and second openings, and being discontinuous on an upper portion of the walls between the lower portion of the walls and the flat top surfaces; and depositing a top electrode layer on the semiconductor layer, the top electrode in contact with the second conductive layer on the upper portion of the walls of the first or second opening.

7. The method of claim 6, wherein the first and second openings are created by one of lithography, liftoff, molding or shadow masking.

8. The method of claim 6, wherein the semiconductor layer is an organic light emitting diode.

9. The method of claim 6, wherein the first dielectric layer is silicon-nitride and the second dielectric layer is a polymer.

10. The method of claim 6, wherein the first and second dielectric layers, the first and second conductive layers and the semiconductor layer are deposited via at least one of PECVD, CVD, sputtering, vapor deposition, printing, spin coating, and spray coating.

11. A device structure providing contact to conductive layers via a deep trench structure, the device structure comprising:

a first dielectric layer including a top surface and a side wall;

a first conductive layer deposited over the first dielectric layer on the top surface and the side wall;

a second dielectric layer deposited on the first conductive layer, the second dielectric layer including a top surface and a side wall;

a second conductive layer having a portion deposited over the top surface of the second dielectric layer and a portion deposited on the side wall of the second dielectric layer and the first conductive layer;

a semiconductor layer having a portion deposited on the portion of the second conductive layer deposited over the top surface of the second dielectric layer, and a continuous portion deposited on the portion of the second conductive layer deposited on a lower portion of the side wall of the second dielectric layer and the first conductive layer, the semiconductor layer being discontinuous over the portion of the second conductive layer deposited on an upper portion of the side wall between the lower portion of the side wall and the top surface; and a top electrode layer deposited on the semiconductor layer, the top electrode layer in contact with the second conductive layer on the upper portion deposited on the side wall of the second dielectric layer and the top electrode layer being in contact with the second conductive layer on the first conductive layer on the upper portion of the side wall of the first dielectric layer.

12. The device structure of claim 11, wherein the side walls of the first and second dielectric layers are created by one of lithography, liftoff, molding or shadow masking.

13. The device structure of claim 11, wherein the semiconductor layer is an organic light emitting diode.

14. The device structure of claim 11, wherein the first dielectric layer is silicon-nitride and the second dielectric layer is a polymer.

15. The device structure of claim 11, wherein the first and second dielectric layers, the first and second conductive layers and the semiconductor layer are deposited via at least one of PECVD, CVD, sputtering, vapor deposition, printing, spin coating, and spray coating.

16. The device structure of claim 11, wherein the side walls of the first and second dielectric layers are positioned at a predetermined angle relative to the respective top surfaces.

17. The device structure of claim 11, wherein the first conductive layer is a backplane for the device structure.

18. The device structure of claim 11, wherein the second conductive layer is a low resistance conductor and the top electrode layer is a high resistance conductor.

19. The device structure of claim 11, wherein the top electrode layer is transparent.

* * * * *